United States Patent
Pan et al.

(10) Patent No.: US 6,509,268 B1
(45) Date of Patent: Jan. 21, 2003

(54) THERMAL DENSIFICATION IN THE EARLY STAGES OF COPPER MOCVD FOR DEPOSITING HIGH QUALITY CU FILMS WITH GOOD ADHESION AND TRENCH FILLING CHARACTERISTICS

(75) Inventors: Wei Pan, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/940,739

(22) Filed: Aug. 27, 2001

(51) Int. Cl.$^7$ ................................................ H01L 21/44
(52) U.S. Cl. ........................ 438/687; 438/624; 438/680; 438/681
(58) Field of Search ................................ 438/639, 643, 438/653, 677, 680, 681, 687

(56) References Cited

U.S. PATENT DOCUMENTS

| | | | |
|---|---|---|---|
| 5,322,712 A | 6/1994 | Norman et al. | 427/250 |
| 5,744,192 A | 4/1998 | Nguyen et al. | 427/99 |
| 5,918,150 A * | 6/1999 | Nguyen et al. | 438/687 |
| 6,165,555 A * | 12/2000 | Jun et al. | 427/252 |
| 6,171,661 B1 * | 1/2001 | Zheng et al. | 427/535 |
| 6,319,728 B1 * | 11/2001 | Bhan et al. | 438/687 |

* cited by examiner

Primary Examiner—David Nelms
Assistant Examiner—D Le
(74) Attorney, Agent, or Firm—David C. Ripma; Matthew D. Rabdau; Scott C. Krieger

(57) ABSTRACT

A method of forming a copper thin film on an integrated circuit substrate having a nitride component includes preparing the substrate; treating the substrate prior to copper deposition; depositing copper during a very short duration copper deposition step lasting between about ten seconds to 40 seconds; baking the substrate and the deposited copper for between about one minute to ten minutes at a temperature greater than 385° C.; and depositing copper during a long duration copper deposition step to deposit copper to the required thickness.

10 Claims, 1 Drawing Sheet

THERMAL DENSIFICATION IN THE EARLY STAGES OF COPPER MOCVD FOR DEPOSITING HIGH QUALITY CU FILMS WITH GOOD ADHESION AND TRENCH FILLING CHARACTERISTICS

FIELD OF THE INVENTION

This invention relates to metal organic chemical vapor deposition (MOCVD) deposition of inter layer metal conductors in integrated circuit processing, and specifically, to a method of deposition of a copper inter layer having good adhesion and trench filling characteristics.

BACKGROUND OF THE INVENTION

There is a need to mass produce copper metal thin film for applications in the electronic industry. Those of ordinary skill in the art are aware of various laboratory methods of copper metal thin film depositions, including the use of various copper precursors, such as $Cu(C_5H_5)(PR_3)$, where R=methyl, ethyl, or butyl; $Cu(hfac)(CH_3C\equiv CCH_3)$, where hfac=hexafluoroacetylacetonate; and Cu(hfac)(tmvs), where tmvs=trimethylvinylsilane. Additionally, the use of various deposition techniques have been described.

To mass produce copper thin films, however, the laboratory methods must be adapted for commercial production. For instance, $Cu(C_5H_5)(PR_3)$ is not a good source for commercial copper chemical vapor deposition (CVD) processing because the carbon and phosphorus contaminate the copper thin film. Additionally, the cost of Cu(hfac)(tmvs) and Cu(hfac)(alkene) precursors is prohibitively high. Further, none of the known processes provide for a rapid CVD of pure, contaminate-free, copper. In the prior art, rapid deposition of copper thin films is achieved using a variety of copper precursors, however, the deposited copper thin films have poor adhesive qualities when applied to metal and/or metal nitride substrates, and such prior art rapid deposition may result in an unacceptably high resistance.

The use of water in CVD of copper is a well known expedient to improve adhesion, wherein a method of adding water vapor to Cu(hfac)(tmvs) improves the deposition rate of copper and increases the resistivity of the deposited copper thin films. The deposition rate of the copper is improved, but the resistivity of the deposited copper is poor.

The use of copper CVD precursors frequently results in the contamination of the resultant copper layer by interfacial carbon fluorine, which is found in copper precursors, such as CupraSelect and similar precursors. Such contamination results in poor adhesion of the deposited copper thin films to the underlying barrier metals. The interfacial contamination is a major obstacle to achieving good adhesion and adequate trench filling.

Because of copper's low resistivity (1.7 $\mu\Omega$-cm) and high electromigration resistance, there has been a great interest in CVD of copper metal thin films. A copper metal thin film is considered the ideal material for use as the metal interconnections in integrated circuit devices.

However, the adhesion of a copper thin film on a metal nitride substrate is difficult to achieve, and generally results in a film exhibiting poor adhesive qualities and conductivity less than that of pure copper. A copper interconnect line is formed by depositing copper onto either of a dual damascene or single damascene trench, wherein the trench is lined with a barrier metal, such as a metal nitride, i.e., titanium nitride or tantalum nitride. The copper interconnect lines are delineated, typically by chemical mechanical polishing (CMP).

Deposition methods may include physical vapor deposition (PVD), metal organic chemical vapor deposition (MOCVD) and electrochemical deposition (ECD), however, PVD has poor step coverage, and ECD requires the initial deposition of a copper seed layer, which, of course, must be deposited by PVD or MOCVD. Because of the poor step coverage of the PVD technique, PVD is not suitable for applications where very narrow, ie., less than 100 nm, trenches are used to form the interconnects. MOCVD is more suited to deposition of copper in deep sub-micron trench/via copper fillings, and for providing the seed layer for ECD, however, the known MOCVD processes do not produce copper layers which have adequate adhesion between the copper layer and a metal barrier layer, such as a nitride layer. One solution is to use flash PVD to form a very thin seed layer prior to CVD or MOCVD, or to add a small amount of silicon to the barrier metal nitride compounds. While such processes provide adequate adhesion and conductivity characteristics for the copper layer, the process complexity is greatly increased, resulting in higher production costs and less throughput, and may increase the barrier metal-to-copper contact resistance.

Copper precursor composition has been modified in an attempt to improve the copper thin film adhesion. CupraSelect (Cu(hfac)(tmvs), or CupraSelect Blend (Cu(hfac)(tmvs)+H(hfac).2H$_2$O) are precursors which have been found to improve the adhesion of copper thin films on a TiN substrate, however, such precursors have not demonstrated improved adhesion on a TaN substrate.

U.S. Pat. No. 5,322,712, to Norman et al., granted Jun. 21, 1994, for Process for Improved Quality of CVD Copper Films, describes introduction of an organometallic copper precursor and a complex copper vapor, or hydrate, of a volatile ligand.

U.S. Pat. No. 5,744,192, to Nguyen et al., granted Apr. 28, 1998, for Method of Using Water Vapor to Increase the Conductivity of Copper Deposited with Cu(hfac)(tmvs), describes use of 0.3% to 3% H$_2$O to increase conductivity of a copper layer.

SUMMARY OF THE INVENTION

A method of forming a copper thin film on an integrated circuit substrate having a nitride component includes preparing the substrate; treating the substrate prior to copper deposition; depositing copper during a very short duration copper deposition step lasting between about 10 seconds to 40 seconds; baking the substrate and the deposited copper for between about one minute to ten minutes at a temperature greater than 385° C.; and depositing copper during a long duration copper deposition step to deposit copper to the required thickness.

It is an object of the invention to provide a process for forming interlayer metal conductors in integrated circuits.

Another object of the invention is to provide copper interconnects which are highly adhesive to nitride substrates.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
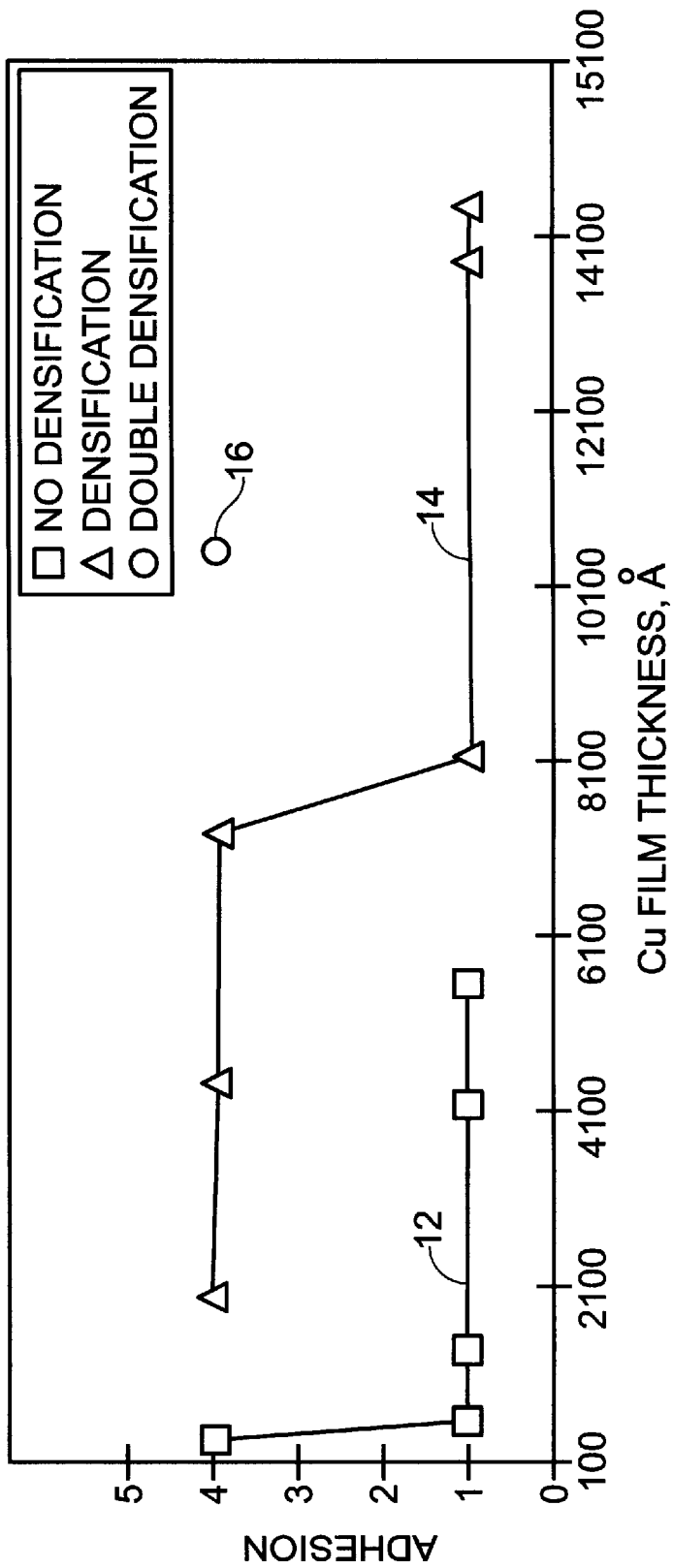
FIG. 1 depicts the adhesive properties of a copper interconnect after having been treated by the method of the invention.

The method of the invention is a method of depositing copper by metal organic chemical vapor deposition (MOCVD) for interlayer metal conductors in integrated circuits. The early stage thermal densification of the method of the invention not only improves copper adhesion to the underlying barrier metal films, but also provides excellent trench filling characteristics.

The thermal densification process of the method of the invention eliminates interfacial carbon fluorine contamination caused by CVD of copper precursors, such as CupraSelect (Cu(hfac)(tmvs)), or CupraSelect Blend (Cu(hfac)(tmvs)+H(hfac).$2H_2O$), and similar precursors, and therefore improves the adhesion of deposited copper thin films to the underlying barrier metals. The interfacial contamination, which has been a major obstacle to achieving good adhesion and better trench filling, is eliminated by the method of the invention.

The thermal densification process of the method of the invention requires 1) an in-situ pre-deposition treatment step; 2) a very short duration copper deposition step, conducted under normal copper CVD conditions; 3) an in-situ vacuum thermal baking step; and 4) a long duration copper deposition step to deposit copper to the required thickness. Steps 2 and 3 may be repeated a number of times to enhance the already-improved adhesion properties.

The pre-deposition treatment step requires heating the wafer in a hydrogen or argon atmosphere, at a pressure of between about 100 mTorr to 1 Torr, for between about 30 seconds and 60 seconds, at a temperature of between about 200° C. to 300° C. The short duration copper deposition step takes place in between about ten seconds to 40 seconds under normal CVD conditions at a wafer temperature of between about 180° C. to 200° C. with a copper precursor gas flow of between about 0.2 ml/min to 0.6 ml/min. and a carrier gas flow of between about 50 sccm to 20 sccm.

The vacuum thermal baking takes place in an argon atmosphere of between about 10 mTorr to 50 mTorr for between about one minute to ten minutes, at a wafer temperature greater than 385° C. The long duration copper deposition step occurs under the same CVD conditions as the short duration step, but continues until copper is deposited to the desired thickness.

The graph of FIG. 1 depicts the results of the method of the invention. As shown in FIG. 1, there is no adhesion for films which do not receive the thermal densification process, trace 12, while the adhesion properties of thin films treated according to the method of the invention are greatly improved, trace 14. Treating the thin film to a double densification process, trace 16, further enhances the adhesive characteristics of the thin film. The adhesion of films were tested using a scratch-tape-peeling test: number 4 means good adhesion while number 1 means no adhesion on a tape peeling test.

Thus, a method for thermal densification in the early stages of copper MOCVD for depositing high quality copper films with good adhesion and trench filling characteristics has been disclosed. It will be appreciated that further variations and modifications thereof may be made within the scope of the invention as defined in the appended claims.

We claim:

1. A method of forming a copper thin film on an integrated circuit substrate having a nitride component comprising:
   preparing the substrate;
   treating the substrate prior to copper deposition;
   depositing copper during a very short duration copper deposition step lasting between about ten seconds to 40 seconds in a CVD chamber;
   baking, in the CVD chamber, the substrate and the deposited copper for between about one minute to 10 minutes at a temperature greater than 385° C.; and
   depositing, in the CVD chamber, copper during a long duration copper deposition step to deposit copper to the required thickness.

2. The method of claim 1 wherein said treating the substrate includes heating the substrate in an atmosphere taken from the group of atmospheres consisting of hydrogen and argon atmosphere; at a pressure of between about 100 mTorr to 1 Torr, for between about 30 seconds and 60 seconds, at a temperature of between about 200° C. to 300° C.

3. The method of claim 1 wherein the short duration copper deposition step takes place at a wafer temperature of between about 180° C. to 200° C. with a copper precursor gas flow of between about 0.2 ml/min to 0.6 ml/min, and a carrier gas flow of between about 50 sccm to 20 sccm.

4. The method of claim 1 wherein said baking step takes place in an argon atmosphere in a partial vacuum of between about 10 mTorr to 50 mTorr.

5. The method of claim 1 wherein said depositing copper during a very short duration copper deposition step and said baking the substrate are repeated prior to the long duration deposition step.

6. A method of forming a copper thin film on an integrated circuit substrate having a nitride component comprising:
   preparing the substrate;
   placing the substrate in a CVD chamber,
   treating the substrate prior to copper deposition in the CVD chamber, including heating the substrate in an atmosphere taken from the group of atmospheres consisting of hydrogen and argon atmosphere; at a pressure of between about 100 mTorr to 1 Torr, for between about 30 seconds and 60 seconds, at a temperature of between about 200° C. to 300° C.;
   in the CVD chamber, depositing copper during a very short duration copper deposition step lasting between about ten seconds to 40 seconds at a wafer temperature of between about 180° C. to 200° C. with a copper precursor gas flow of between about 0.2 ml/min to 0.6 ml/min, and a carrier gas flow of between about 50 sccm to 20 sccm;

in the CVD chamber, baking the substrate and the deposited copper for between about one minute to 10 minutes at a temperature greater than 385° C.; and in the CVD chamber, depositing copper during a long duration copper deposition step to deposit copper to the required thickness.

7. The method of claim 6 wherein said baking takes place in an argon atmosphere in a partial vacuum of between about 10 mTorr to 50 mTorr.

8. The method of claim 6 wherein said depositing copper during a very short duration copper deposition step and said baking the substrate are repeated prior to the long duration deposition step.

9. A method of forming a copper thin film on an integrated circuit substrate having a nitride component comprising:

preparing the substrate;

treating the substrate prior to copper deposition, including heating the substrate in an atmosphere taken from the group of atmospheres consisting of hydrogen and argon atmosphere; at a pressure of between about 100 mTorr to 1 Torr, for between about 30 seconds and 60 seconds, at a temperature of between about 200° C. to 300° C.;

depositing copper during a very short duration copper deposition step lasting between about ten seconds to 40 seconds at a wafer temperature of between about 180° C. to 200° C. with a copper precursor gas flow of between about 0.2 ml/min to 0.6 ml/min, and a carrier gas flow of between about 50 sccm to 20 sccm;

vacuum thermal baking the substrate and the deposited copper for between about one minute to 10 minutes at a temperature greater than 385° C., in an argon atmosphere of between about 10 mTorr to 50 mTorr; and depositing copper during a long duration copper deposition step to deposit copper to the required thickness.

10. The method of claim 9 wherein said depositing copper during a very short duration copper deposition step and said baking the substrate are repeated prior to the long duration deposition step.

* * * * *